United States Patent
Schreck et al.

(10) Patent No.: US 6,825,420 B2
(45) Date of Patent: Nov. 30, 2004

(54) CONDUCTOR OF FLEXIBLE MATERIAL, COMPONENT COMPRISING SUCH FLEXIBLE CONDUCTOR, AND METHOD OF MANUFACTURING SUCH CONDUCTOR

(75) Inventors: Wolfgang Schreck, Esslingen (DE); Jochen Scholz, Lorch (DE); Andreas Romberg, Backnang (DE)

(73) Assignee: Schefenacker Vision Systems Germany GmbH & Co. KG, Esslingen (DE)

(*) Notice: Subject to any disclaimer, the term of this patent is extended or adjusted under 35 U.S.C. 154(b) by 0 days.

(21) Appl. No.: 10/340,866

(22) Filed: Jan. 10, 2003

(65) Prior Publication Data

US 2003/0168247 A1 Sep. 11, 2003

(30) Foreign Application Priority Data

Jan. 12, 2002 (DE) .......................................... 102 00 961
Dec. 20, 2002 (DE) .......................................... 102 61 772

(51) Int. Cl.$^7$ ................................................. H01B 7/08
(52) U.S. Cl. ..................................... 174/117 F; 362/546
(58) Field of Search ......................... 174/117 F, 117 FF; 362/184, 240, 241, 373, 546, 543, 297, 346, 545

(56) References Cited

U.S. PATENT DOCUMENTS 5,580,156 A * 12/1996 Suzuki et al. ............... 362/184
2003/0063477 A1 * 4/2003 Stepanenko et al. ........ 362/546

* cited by examiner

Primary Examiner—Chau N. Nguyen
(74) Attorney, Agent, or Firm—Gudrun E. Huckett

(57) ABSTRACT

A conductor of flexible material on which electronic or electric components are arranged, is embedded at least partially in at least one shape-stable component. The conductor is manufactured by mounting the electric or electronic components on the flexible conductor, placing and positionally securing the conductor provided with the electric or electronic components into an injection mold, and embedding the conductor least partially in plastic material.

21 Claims, 5 Drawing Sheets

CONDUCTOR OF FLEXIBLE MATERIAL, COMPONENT COMPRISING SUCH FLEXIBLE CONDUCTOR, AND METHOD OF MANUFACTURING SUCH CONDUCTOR

BACKGROUND OF THE INVENTION

The invention relates to a conductor of flexible material on which electronic and/or electric components are arranged, a modular component, in particular for motor vehicles, comprising at least one flexible conductor on which at least one electric and/or electronic component is arranged, as well as a method for manufacturing such a conductor.

It is known, for example, in connection with lamp units for motor vehicles to arrange within the lamp housing a reflector which reflects the light emitted by the LEDs to the exterior. The LEDs are mounted on a flexible conductor foil. Mounting of the flexible conductor with the LEDs is difficult because the LEDs must be positioned in a precise mounting position within the lamp unit. This is difficult because of the flexibility of the conductor.

SUMMARY OF THE INVENTION

It is an object of the invention to configure the conductor of the aforementioned kind, the modular component of the aforementioned kind, and the method of the aforementioned kind such that the flexible conductor can be mounted in a simple way in a desired mounting position.

This object is solved according to the invention for a conductor of the aforementioned kind in that the conductor is embedded at least partially in at least one shape-stable component, and, according to the invention, in regard to the component of the aforementiond kind in that the flexible conductor is at least partially embedded in a plastic layer, and, according to the invention, for the method of the aforementioned kind in that the electronic and/or electric component (4,4a) is mounted on a flexible conductor (9,9a), that the conductor (9,9a) provided with the components (4,4a) is placed into an injection mold and positionally secured, and that the conductor (9,9a) is at least partially embedded in plastic material.

The flexible conductor according to the invention is at least partially embedded within the shape-stable modular component. By means of this shape-stable modular component, the conductor acquires its shape stability so that it can be mounted without problems in a precise mounting position. Moreover, the conductor is protected in the shape-stable modular component against damage.

In the modular component according to the invention, the flexible conductor is embedded at least partially in the plastic layer. Accordingly, when mounting the modular component, the conductor no longer must be mounted separately but forms together with the shape-stable plastic layer a modular component which can be mounted simply.

According to the method of the invention, the conductor is provided first with electronic and/or electric component and subsequently inserted into the injection mold and positionally secured. Subsequently, the conductor is at least partially embedded in the plastic material. After hardening of the plastic material, the partially embedded conductor can be removed from the injection mold.

Further features of the invention result from the additional claims, the description, and the drawings.

BRIEF DESCRIPTION OF THE DRAWINGS

Further features of the invention result from the additional claims, the description, and the drawings.

DESCRIPTION OF PREFERRED EMBODIMENTS

Figure 1:
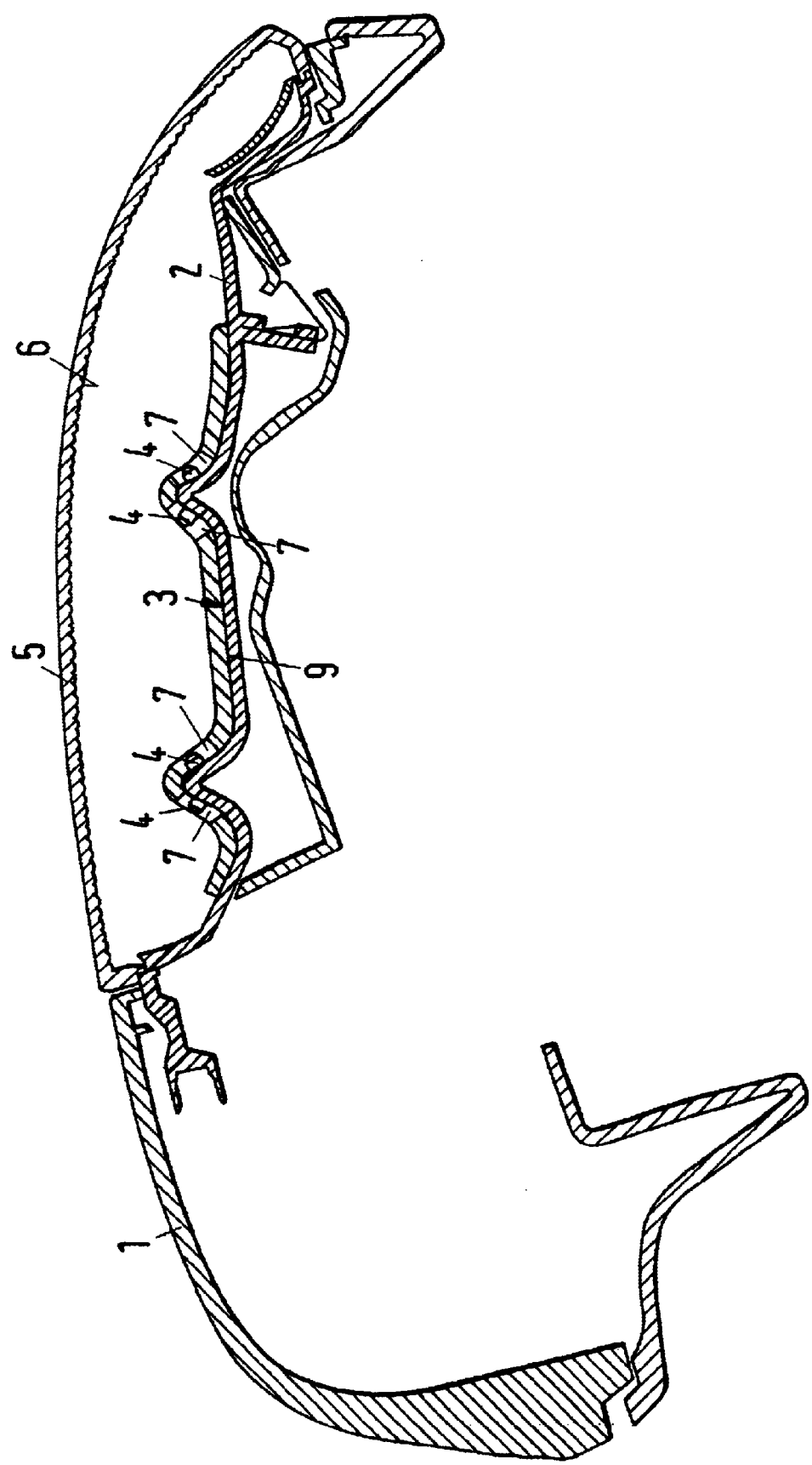
FIG. 1 in a sectional view a part of a lamp unit with a conductor according to the invention.

FIG. 1 shows a lamp unit which is a taillight of a motor vehicle in this embodiment. The lamp unit has a housing 1 in which a carrier 2 is arranged. It is comprised preferably of plastic material but can also be made of other suitable material. The carrier 2 and a reflector 3 form a unitary part. The reflector reflects the rays emitted by the illumination means 4 to the lens 5 through which the light reaches the exterior. The configuration of such a taillight of motor vehicles is known and is therefore not described in more detail. The lens 5 can be provided at its inner side with illumination optics 6 which will be explained by means of the embodiments according to FIGS. 5 and 6.

Figure 2:
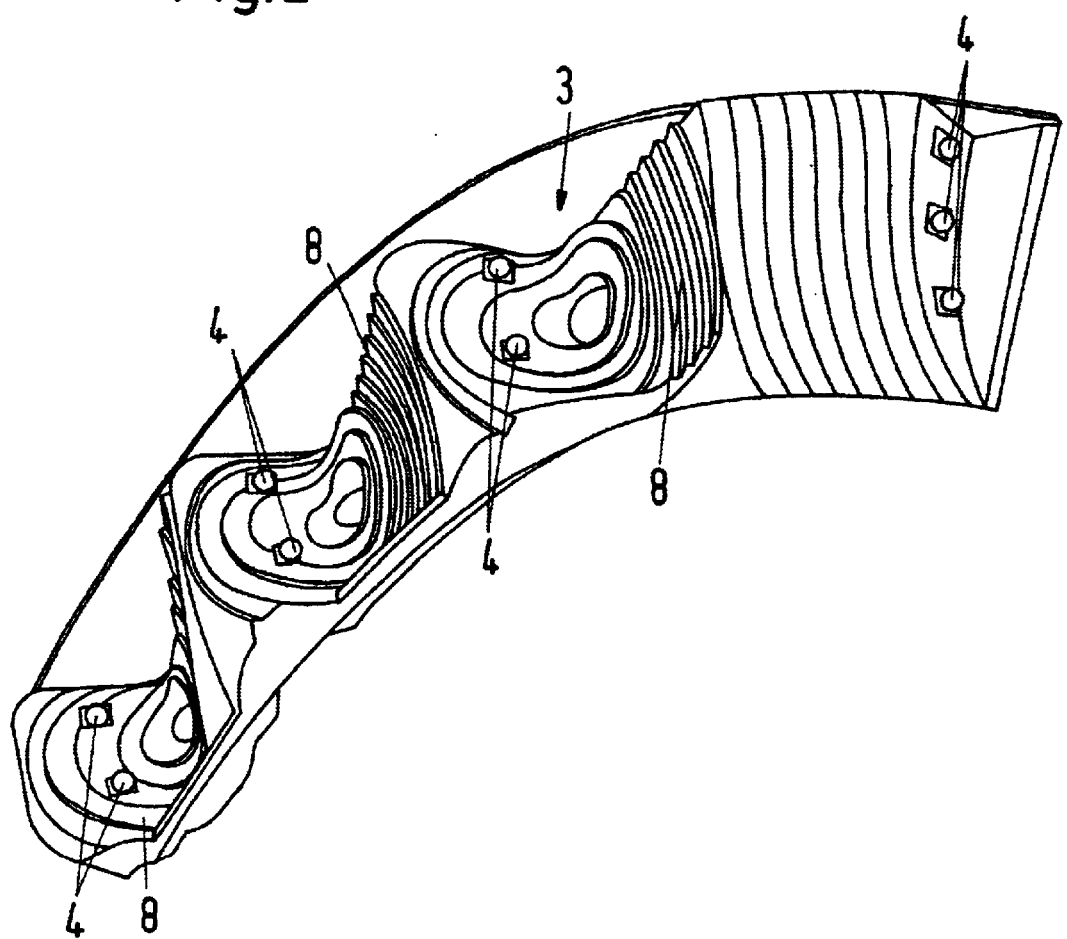
FIG. 2 in a perspective illustration a reflector of the lamp unit according to FIG. 1 provided with the conductor according to the invention.
Figure 3:
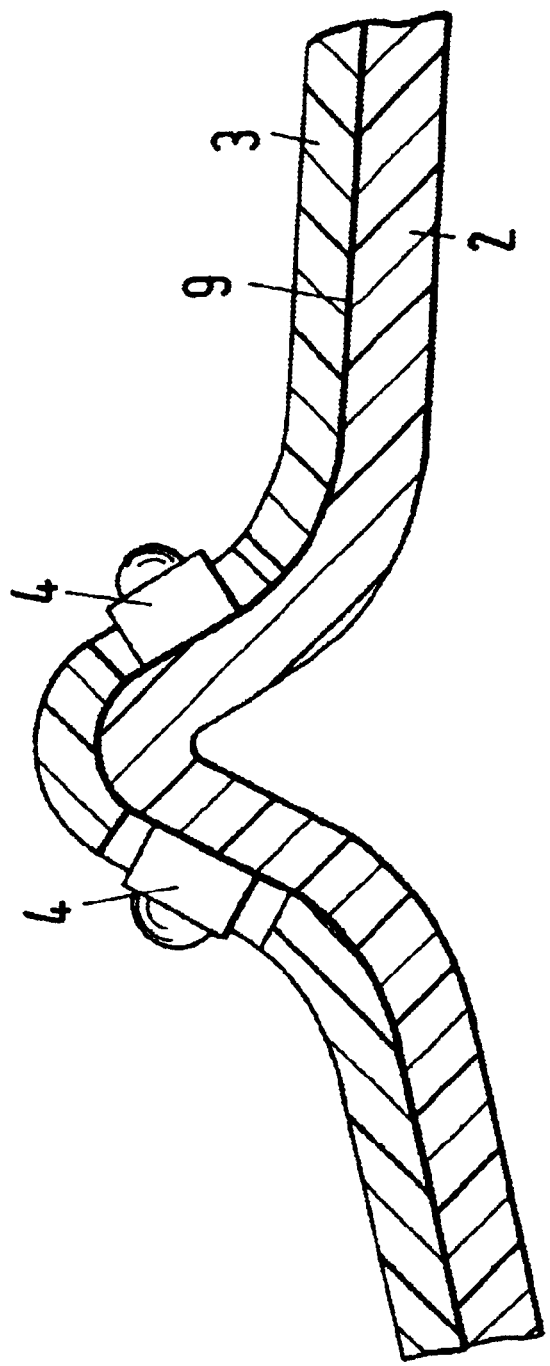
FIG. 3 in a magnified illustration in section a portion of the conductor according to the invention.

The reflector 3 has openings 7 in which the illumination means 4 are positioned. As shown in FIG. 2, the reflector 3 has reflector surfaces 8 for each one of the illumination means 4, respectively. The illumination means 4 are advantageously LEDs mounted on a conductor 9. It is also possible to employ SMDs as illumination means 4. As shown in FIG. 2, the illumination means 4 in this embodiment are arranged in the area of the reflector surfaces in pairs. Depending on the configuration of the reflector 3, several such illumination means 4 can be correlated with the corresponding reflector surface 8. Of course, it is also possible to provide for each reflector surface 8 only a single illumination means 4. In the embodiment, there are three additional illumination means 4 provided on the side; they are positioned at a spacing from one another. Advantageously, they are also LEDs and do not radiate through the lens 4 but transversely thereto.

The conductor 9 is a flexible conductor foil via which the current supply to the illumination means 4 is realized as is known in the art. Since the conductor 9 is flexible, it can be matched to any shape of the carrier 2 and/or of the reflector 3.

Figure 4:
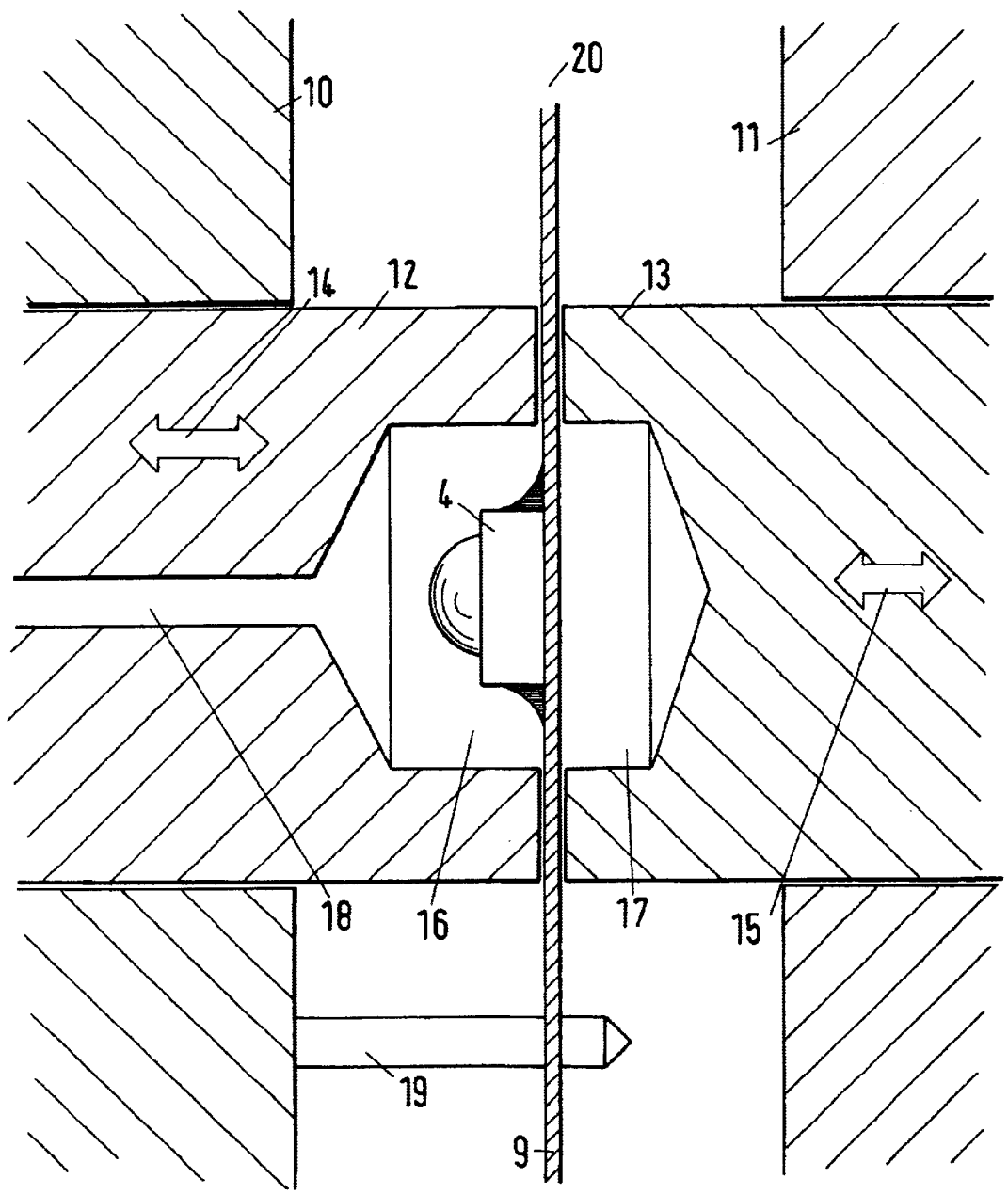
FIG. 4 in section and in a simplified illustration an injection mold for manufacturing the conductor according to the invention.

The carrier 2 and the reflector 3 enclose the conductor 9. When manufacturing the carrier 2 and the reflector 3, the conductor 9 is embedded by the material of these two parts 2, 3. In this way, the conductor 9 is properly secured and protected. FIG. 4 shows schematically a portion of an injection mold. It has to mold parts 10, 11, wherein mold part 10 is stationary and mold part 11 is movable. Both mold parts 10, 11 have at least one securing plunger 12, 13 arranged so as to be movable relative to one another within the shaped parts 10, 11. Between them, the flexible conductor 9 is clamped during the injection molding process. The two securing plungers 12, 13 are adjustable in the direction of the double arrow 14, 15 illustrated in FIG. 4. Both securing plungers 12, 13 are configured such that they have at least one hollow space 16, 17. The two hollow spaces 16, 17 are positioned opposite one another and form a common hollow space divided by the conductor 9. The hollow space is configured such that the illumination means 4 mounted on the conductor 9 can be received therein during the injection molding process. The two holding plungers 12, 13 clamp the conductor 9 in the area adjacent to the illumination means 4 such that the plastic material introduced into the injection mold cannot penetrate into the hollow space 16, 17.

Depending on the number of illumination means 4 which are mounted on the conductor 9, a corresponding number of securing plungers with corresponding hollow spaces are provided in the injection mold.

A vacuum channel 18 can open into the hollow space 16 of one securing plunger 12 via which a vacuum can be created in the hollow space during the injection molding process.

The injection mold can be provided additionally with at least one loading plunger 19.

As is known in the art, the plastic material for the carrier 2 and the reflector 3 is injected into the injection mold. The conductor 9 which is clamped in the hollow space 20 between the securing plungers 12,13 is embedded in this plastic material. The illumination means 4 provided on the conductor 9 are protected during this injection molding process within the space 16, 17 of the securing plungers 12, 13. The securing plungers 12, 13 are configured such that they clamp the conductor 9 only in direct vicinity of the illumination means 4 so that in other areas the conductor 9 can be embedded in the plastic material for the carrier 2 and the reflector 3. As a result of the clamping action of the conductor 9 by means of the securing plungers 12, 13, it is ensured that the illumination means 4 are in their exact mounting position on the carrier 2 and the reflector 3. The flexible foil-like conductor 9 itself must not have a precise mounting position because it is embedded by the plastic material of the carrier 2 and of the reflector 3 and, in this way, is positionally secured. After the injection molding process, the injection mold is opened so that the modular unit comprised of the carrier 2, the reflector 3, and the embedded conductor 9 can be removed and mounted in the housing 1. In this way, the manufacture and assembly of the lamp unit is simple and inexpensive.

The lamp unit can be, for example, a turn signal, a taillight, a headlight, or generally a signal light of a motor vehicle. However, the embedded conductor can also be used for interior and/or instrumentation illumination of motor vehicles, for example, as a dashboard light, cockpit light, a door handle light and the like.

In addition to the illumination means, sensors or other electronic and/or electric components can be mounted on the conductor 9 embedded in the plastic material. In addition to its use in motor vehicles, the embedded conductor 9 can be used also in cameras, acoustic signaling devices and the like.

Figure 5:
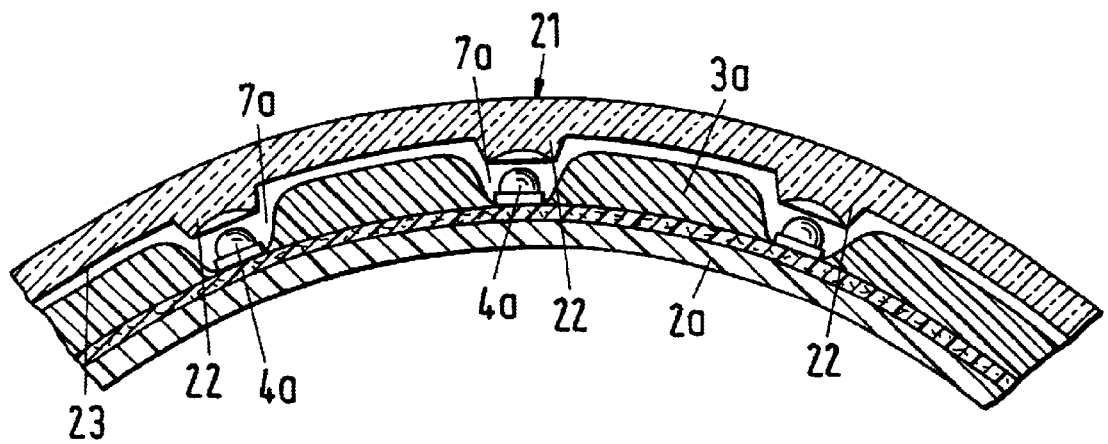
FIGS. 5 and 6 a further embodiment, respectively, of the component according to the invention in an illustration corresponding to FIG. 3.

FIG. 5 shows a lamp unit in which the conductor 9, in accordance with the afore described embodiment, is arranged between a carrier 2*a* and a reflector 3*a*. The conductor 9*a* supports also LEDs 4*a*, which are located in openings 7*a* of the reflector 3*a*. This lamp unit differs from that according to FIGS. 1 through 4 only in that instead of the lens 5 a light guide 21 is provided which is manufactured, as is known in the art, of a light-conducting plastic material. The light guide 21 has optics 22 which are formed as unitary truncated cone-shaped projections on the inner side 23 of the light guide 21. Each LED 4*a* is provided with optics 22. By means of these optics 22 integrated into the conductor 21, the conventional lens 5 can be eliminated. Lamps with such a configuration are extremely flat and require only a minimal mounting space on the vehicle. Advantageously, it is possible in this way to employ a closed sheet metal skin on the vehicle. Moreover, this lamp unit is comprised of only a few individual parts so that it can be inexpensively manufactured and mounted. Moreover, it is also possible to employ vapor-deposit parts. Also, filters for generating a desired color are not required in the lens because the light guide 21 can be have different colors. In this embodiment, it is also possible to provide, instead of the reflector 3*a*, only a single plastic layer which is provided only at the side facing the light guide 21 with an electroluminescent foil (not illustrated) or a reflector band. Preferably, the foil or the band is inserted into the outer side of the plastic layer 2*a*.

Figure 6:
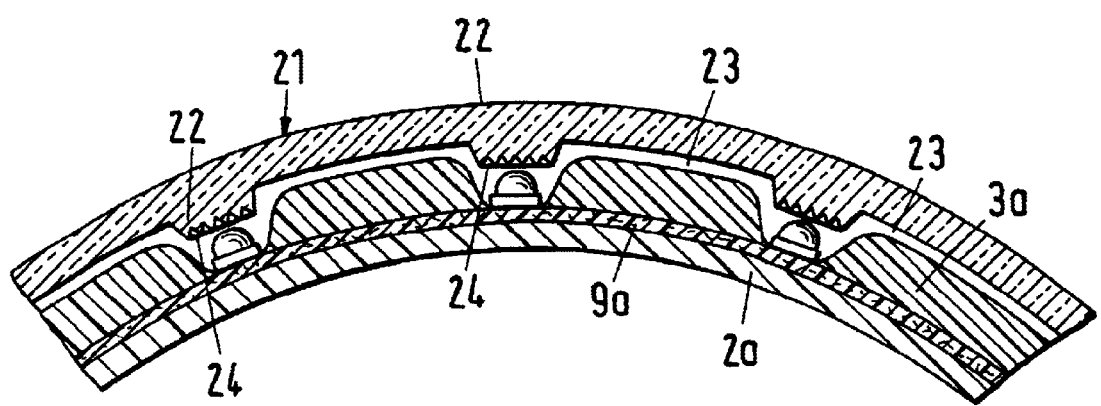

As shown in FIG. 6, the end faces of the optics 22 facing the LEDS 4*a* can be profiled and, accordingly, can serve as reflectors.

Since the conductors 9, 9*a* are embedded in plastic material, an optimal heat distribution and heat dissipation result. Additional measures for heat distribution or heat dissipation are therefore not required.

The plastic material for the carrier 2 or 2*a* and/or the reflector 3 can be thermoplastic materials, such as polycarbonate, acrylonitrile butadiene styrene copolymer (ABS), polybutylene terephthalate (PBT), polyamide and similar materials. Thermoplastic materials have a relatively low melting point so that, when injection molding the carrier 2, 2*a* and the reflector 3, 3*a* there is no risk of damaging the electric and/or electronic components 4, 4*a* arranged on the conductor 9, 9*a*.

For improving the heat dissipation, additives can be added to the plastic material, for example, mineral materials, glass, powder, fibers, ceramic materials and similar materials. These additives can be present in an amount of up to approximately 60% by weight.

What is claimed is:

1. A modular component comprising:
   a first shape-stable component;
   a flexible conductor foil having conductor paths;
   at least one of an electric component and an electronic arranged on and electrically connected to the flexible conductor foil;
   a second shape-stable component having at least one opening;
   wherein the flexible conductor foil and the at least one of the electric component and the electronic component arranged on and electrically connected to the flexible conductor foil are embedded in the first and second shape-stable components such that only the at least one of the electric component and the electronic component projects through the at least one opening.

2. The modular component according to claim 1, wherein the first and second shape-stable components form a single unitary part.

3. The modular component according to claim 1, wherein the at least one of the electric component and the electronic component is an illuminating means.

4. The modular component according to claim 3, wherein the second shape-stable component is a reflector.

5. The modular component according to claim 3, wherein the illuminating means is an LED or an SMD.

6. The modular component according to claim 3, further comprising a light guide arranged in front of the second shape-stable component and the illuminating means.

7. The modular component according to claim 6, wherein the light guide comprises at least one illumination optic for the illumination means.

8. The modular component according to claim 7, wherein the illumination optics is a part of the light guide.

9. The modular component according to claim 7, wherein the illumination optics is a projection projecting past an inner side of the light guide.

10. The modular component according to claim 9, wherein the second shape-stable component has a side facing the light guide and the side has at least one reflector part.

11. The modular component according to claim 9 as a lamp unit of a motor vehicle.

12. The modular component according to claim 7, wherein for each one of the illumination means one of the at least one illumination optics is provided.

13. The modular component according to claim 7, wherein the illumination optics has at least one reflector surface.

14. The modular component according to claim 13, wherein the at least one reflector surface is a tooth-shaped profiling provided on an end face of the illumination optics.

15. The modular component according to claim 6, wherein the light guide is multi-colored.

16. The modular component according to claim 1, wherein at least one of the first and second shape-stable components is comprised of plastic material.

17. The modular component according to claim 16, wherein the plastic material is at least one thermoplastic material.

18. The modular component according to claim 16, wherein the plastic material contains additives.

19. The modular component according to claim 18, wherein the additives are present in the plastic material in an amount of up to approximate 60% by weight.

20. The modular component according to claim 18, wherein the additives are comprised of heat-dissipating material.

21. The modular component according to claim 20, wherein the additives are mineral substances, fibers, or ceramics.

* * * * *